United States Patent
Li et al.

(10) Patent No.: US 11,875,223 B2
(45) Date of Patent: Jan. 16, 2024

(54) QUANTUM BIT CONTROL APPARATUS

(71) Applicant: Huawei Technologies Co., Ltd., Shenzhen (CN)

(72) Inventors: Zhengyu Li, Shenzhen (CN); Changzheng Su, Shenzhen (CN); Yang Zou, Zürich (CH); Yongjing Cai, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 450 days.

(21) Appl. No.: 17/243,072

(22) Filed: Apr. 28, 2021

(65) Prior Publication Data
US 2021/0279630 A1 Sep. 9, 2021

Related U.S. Application Data
(63) Continuation of application No. PCT/CN2019/112421, filed on Oct. 22, 2019.

(30) Foreign Application Priority Data
Oct. 29, 2018 (CN) .......................... 201811268446.7

(51) Int. Cl.
 G06N 10/00 (2022.01)
 H10N 69/00 (2023.01)
(52) U.S. Cl.
 CPC ............. G06N 10/00 (2019.01); H10N 69/00 (2023.02)
(58) Field of Classification Search
 USPC ........................................................ 716/100
 See application file for complete search history.

(56) References Cited

U.S. PATENT DOCUMENTS 9,520,180 B1 * 12/2016 Mukhanov ............. A61K 8/345
9,589,236 B1 * 3/2017 Abdo ..................... G06N 10/00
(Continued)

FOREIGN PATENT DOCUMENTS

| CN | 101059556 A | 10/2007 |
| CN | 105264680 A | 1/2016 |

(Continued)

OTHER PUBLICATIONS

Michaelis De Vasconcellos, S. et al., "Coherent Control of a Single Exciton qubit by Optoelectronic Manipulation," Nature Photonics, Published Online: Jun. 6, 2010, 4 pages.
(Continued)

*Primary Examiner* — Mohammed Alam
(74) *Attorney, Agent, or Firm* — SLATER MATSIL, LLP

(57) ABSTRACT

A quantum bit control apparatus, including a control signal generator, optoelectronic detectors, a quantum chip, and a shielding apparatus, the optoelectronic detectors are disposed in the shielding apparatus, and an inner part of the shielding apparatus is in a vacuum state. The control signal generator is disposed in a first temperature area, and is configured to generate optical control signals and send the N optical control signals to the optoelectronic detectors. The optoelectronic detectors are disposed in a second temperature area having a temperature lower than of the first temperature area. The N optoelectronic detectors are configured to convert the received optical control signals into electronically controlled signals and send the electronically controlled signals to the quantum chip. The quantum chip is disposed in the second temperature area, and controls a quantum bit in the quantum chip based on the electronically controlled signals.

20 Claims, 7 Drawing Sheets

(56) References Cited

U.S. PATENT DOCUMENTS

| | | | | |
|---|---|---|---|---|
| 10,846,618 B2* | 11/2020 | Ravi | ............... | G06N 20/00 |
| 2018/0102470 A1* | 4/2018 | Das | ............... | H01L 23/5384 |
| 2021/0279630 A1* | 9/2021 | Li | ............... | G06N 10/40 |

FOREIGN PATENT DOCUMENTS

| | | | |
|---|---|---|---|
| CN | 107220026 A | | 9/2017 |
| CN | 107870974 A | | 4/2018 |
| CN | 207282490 U | | 4/2018 |
| CN | 108090569 A | | 5/2018 |

OTHER PUBLICATIONS

Nilsson, J. et al., "Quantum Teleportation using a Light-Emitting Diode," Nature Photonics, Published Online: Feb. 24, 2013, 5 pages.

* cited by examiner

QUANTUM BIT CONTROL APPARATUS

CROSS-REFERENCE TO RELATED APPLICATIONS

This application is a continuation of International Application No. PCT/CN2019/112421, filed on Oct. 22, 2019, which claims priority to Chinese Patent Application No. 201811268446.7, filed on Oct. 29, 2018. The disclosures of the aforementioned applications are hereby incorporated by reference in their entireties.

TECHNICAL FIELD

This application relates to the field of quantum computing technologies, and in particular, to a quantum bit control apparatus.

BACKGROUND

A quantum computer is a general-purpose computing device using quantum logic. Because of a superposition characteristic of a quantum state, large-scale "parallel" computing becomes possible, which attracts wide attention. The quantum computer is different from an electronic computer (or a conventional computer). Quantum computing uses a quantum bit to store data and uses a quantum algorithm to perform a data operation. The quantum bit is similar to a semiconductor logic gate on the conventional computer. With more quantum bits, a parallel acceleration capability of the quantum bit is stronger, and a solution speed of the quantum bit to a same problem is faster. The quantum bit can be constructed in a plurality of physical systems, such as a superconducting circuit, an ion trap, a semiconductor quantum dot, and topological quantum computing. Different systems have their own advantages, but in terms of a quantity of controllable quantum bits that have been implemented, the superconducting circuit system is a preferred one at present.

A basic unit of superconducting quantum computing is a superconducting quantum circuit. The superconducting quantum circuit needs to work in an ultra-low temperature environment, and about 10 to 20 mK (Kelvins) ultra-low temperature can effectively reduce impact caused by environmental noise. Currently, a commonly used refrigeration device is a dilution refrigerator. The dilution refrigerator uses a hierarchical refrigeration technology, and further performs refrigeration in an extremely low temperature area by using a helium element in phase change heat absorption, to obtain a lowest temperature area. FIG. 1 shows a basic structure of a common dilution refrigerator and an expected temperature of each cold plate. A cold plate in the lowest temperature area needs to reach a temperature of about 10 to 20 mK.

To control a quantum bit at a bottom layer, an electrical signal is required to enter a mixed chamber (MXC) at the bottom layer. Signal lines of these control signals pass through different cold plates layer by layer, and cool down at each cold plate to reduce heat transfer to the MXC. When each control signal is conducted to a quantum chip at the bottom layer, power of each control signal is as low as about −120 dBm to −130 dBm. Even if thousands of control signals generate heat at the chip, the heat can be ignored compared with refrigeration power of the cold plate. In addition, the dilution refrigerator is vacuumized inside a shielding apparatus, and there is basically only heat radiation within a barrel wall. Therefore, heat conduction of control signal lines is a maximum source of heat input to the entire cold plate.

It is easy to understand that heat conduction power of a single control signal line is related to a cable material, contact area, length, and temperature difference, and total heat conduction power is directly proportional to a quantity of the control signal lines. In addition, currently each quantum bit needs at least one control signal line. Therefore, a quantity of superconducting quantum bits that can be supported by a dilution refrigerator is limited. As the quantity of quantum bits increases, the quantity of quantum bits can no longer increase when heat conduction power on a cold plate is greater than refrigeration power of the cold plate. Currently, refrigeration power of a common commercial dilution refrigerator can allow about 330 signal lines. This quantity is sufficient for a current quantity of superconducting quantum bits ($\leq 72$). However, considering a future capacity expansion requirement and a current situation that a quantity of quantum bits on a superconducting quantum chip rapidly increases, the current refrigeration power is obviously insufficient, which greatly limits the increase of the quantity of controllable quantum bits and affects system capacity expansion.

SUMMARY

An objective of this application is to provide a superconducting quantum bit control apparatus, to resolve a problem that system capacity expansion cannot be supported because existing refrigeration power is insufficient.

According to a first aspect, a quantum bit control apparatus is provided, including a control signal generator, N optoelectronic detectors, a quantum chip, and a shielding apparatus, where N is a positive integer greater than 1. The control signal generator is located in a first temperature area, and is configured to generate N optical control signals, and respectively send the N optical control signals to the N optoelectronic detectors located in the shielding apparatus, where an inner part of the shielding apparatus is in a vacuum state. The N optoelectronic detectors are located in a second temperature area, and are configured to convert the received optical control signals into electronically controlled signals, and send the electronically controlled signals to the quantum chip located in the shielding apparatus, where a temperature of the second temperature area is lower than that of the first temperature area. The quantum chip is located in the second temperature area, and is configured to control a quantum bit in the quantum chip based on the received N electronically controlled signals.

DETAILED DESCRIPTION OF ILLUSTRATIVE EMBODIMENTS

The following describes the technical solutions in the embodiments of this application with reference to the accompanying drawings in the embodiments of this application.

Figure 1:
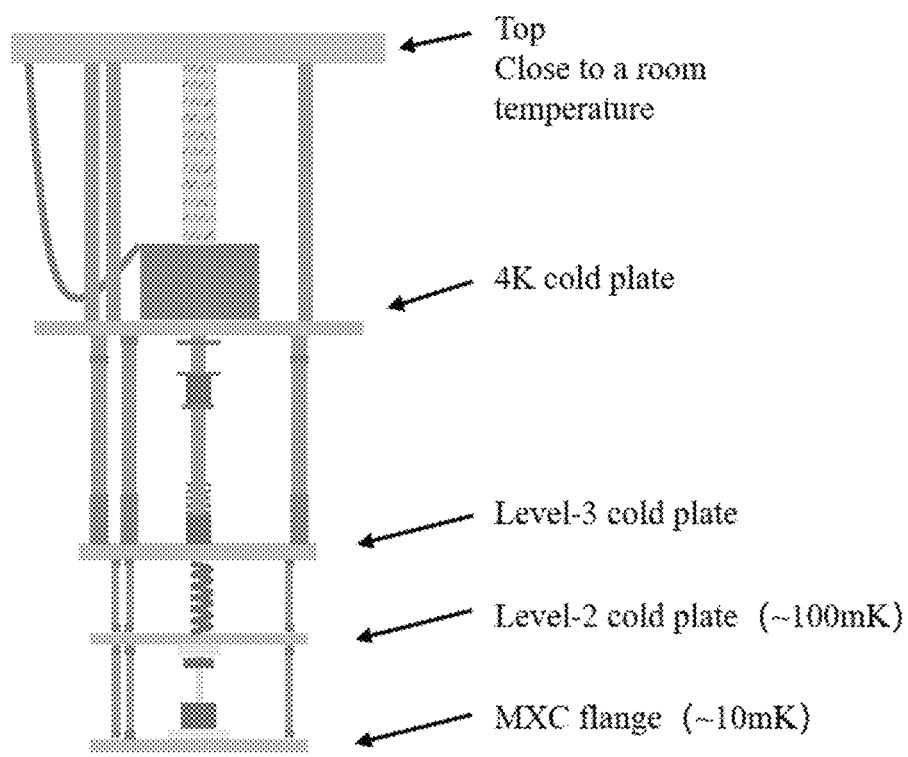
FIG. 1 is a diagram of a basic structure of a dilution refrigerator.
Figure 2:
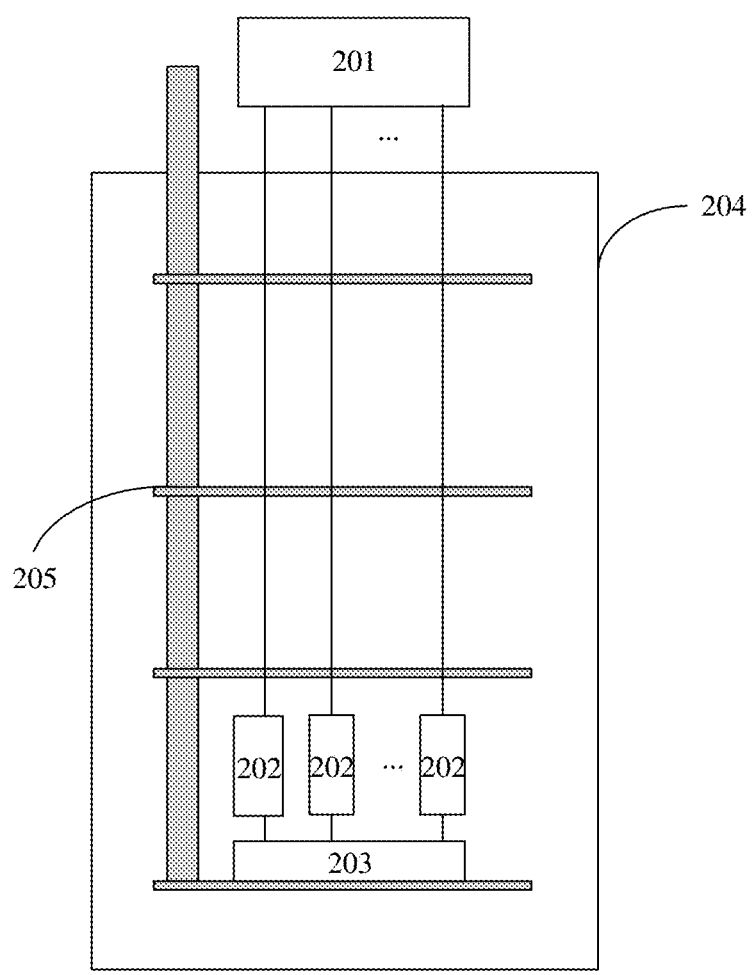
FIG. 2 is a block diagram of a structure of a quantum bit control apparatus according to an embodiment of this application.

The following describes in detail a quantum bit control apparatus 200 provided in this application with reference to FIG. 2. FIG. 2 is a schematic block diagram of the quantum bit control apparatus 200 according to an embodiment of this application.

The quantum bit control apparatus 200 includes a control signal generator 201, N optoelectronic detectors 202, a quantum chip 203, and a shielding apparatus 204, where N is a positive integer greater than 1. The control signal generator 201 is located outside the shielding apparatus 204, the N optoelectronic detectors 202 and the quantum chip 203 are all located inside the shielding apparatus 204, and an inner part of the shielding apparatus 204 is in a vacuum state. It should be understood that the shielding apparatus 204 may be of a barrel shape, a square shape, or the like, and may have a function of shielding external electromagnetic interference.

The control signal generator 201 is located in a first temperature area, and is configured to generate N optical control signals, and respectively send the N optical control signals to the N optoelectronic detectors 202. The N optoelectronic detectors 202 are located in a second temperature area, and are configured to convert the received optical control signals into electronically controlled signals, and send the electronically controlled signals to the quantum chip 203. The quantum chip 203 is located in the second temperature area, and is configured to control a quantum bit in the quantum chip 203 according to the received N electronically controlled signals. A temperature of the second temperature area is lower than that of the first temperature area.

Usually, the temperature of the first temperature area may be a room temperature, the temperature of the second temperature area may be lower than 4 K, and a lowest temperature of the first temperature area is also higher than a highest temperature of the second temperature area. In addition, the second temperature area may further include a plurality of sub-temperature areas. The optoelectronic detectors and the quantum chip may be placed in a same sub-temperature area, or may be placed in different sub-temperature areas. For example, an existing superconducting quantum chip needs to work in an ultra-low temperature environment (about 10 mK), and therefore a temperature of a sub-temperature area may be between 10 mK and 4 K. Assuming that the second temperature area includes a 10 mK sub-temperature area, a 100 mK sub-temperature area, and a 4 K sub-temperature area, the quantum chip 203 may be located in the 10 mK sub-temperature area, and the optoelectronic detectors 202 may be located in any one of the three sub-temperature areas, and are better near the 10 mK sub-temperature area in which the quantum chip 203 is located. To be specific, the optoelectronic detector in this application is a low-temperature optoelectronic detector, and may work in an environment below 4 K, or may even work at a temperature below 10 mK. A specific working temperature is not limited. It should be noted that, because a size of a future superconducting quantum chip may be smaller, a carrier frequency of a manipulation signal of the superconducting quantum chip will be further increased, so that the superconducting quantum chip can work in a higher temperature environment. Therefore, in the future, a working temperature of the quantum chip may be increased to 100 mK or even higher. The working temperature of the quantum chip is not limited in this embodiment of this application.

Further, the quantum bit control apparatus 200 further includes a refrigerator 205. The refrigerator includes a refrigeration pipe and a plurality of cold plates separately connected to the refrigeration pipe, a part of the refrigeration pipe is located in the shielding apparatus 204, and the plurality of cold plates are all located in the shielding apparatus 204, as shown in FIG. 2. The refrigeration pipe is configured to provide different refrigeration power for different cold plates, to form sub-temperature areas with different temperatures in the second temperature area. For example, assuming that the refrigerator 205 includes three cold plates, and temperatures of the three cold plates may be successively reduced to about 4 K, 100 mK, and 10 mK by using the refrigeration power provided by the refrigeration pipe. In this way, the three cold plates and surrounding areas form three different sub-temperature areas. The quantum chip 203 may be located on the 10 mK cold plate, to meet a working temperature of the quantum chip 203 at a current stage. The optoelectronic detectors 202 may be located on any cold plate. Because electrical signals output by the optoelectronic detectors 202 need to be transmitted through a wire, and thermal conductivity of the wire is relatively strong, the closer the optoelectronic detectors 202 are to the quantum chip 203, the smaller a temperature difference between the optoelectronic detectors 202 and the quantum chip 203 is, and the less impact caused by heat conduction of the wire is. Therefore, when the optoelectronic detectors 202 and the quantum chip 203 are located on a same cold plate, a heat insulation effect is the best.

According to the quantum bit control apparatus provided in this embodiment of this application, the optical control signals are transmitted to the optoelectronic detectors located in the second temperature area, and then converted into the electronically controlled signals and sent to the quantum chip. Because a thermal conductivity of an optical fiber is small (if spatial light is used, the heat insulation effect is better), heat transfer from the first temperature area to the second temperature area is greatly reduced. With same refrigeration power, more control signals can be supported, and system capacity expansion is further supported.

Specifically, there are many manners of transferring the optical control signals from the control signal generator 201 to the shielding apparatus 204. For example, the optical control signals are emitted into the shielding apparatus 204 in a form of spatial light. In this case, one side of the shielding apparatus 204 needs to include a transparent window. Alternatively, the optical control signals enter the shielding apparatus 204 in a form of an optical fiber array. One end of the optical fiber array is inside the shielding apparatus 204, and the other end is outside the shielding apparatus 204. The optical fiber array and the shielding apparatus 204 need to be sealed. For the foregoing transfer manner, the following provides several specific implementations of transferring the optical control signals from the control signal generator 201 to the optoelectronic detectors 202.

(1) One side of the shielding apparatus 204 includes the transparent window, and the control signal generator 201 emits the N optical control signals into the N optoelectronic detectors 202 located in the shielding apparatus 204 in a form of N spatial lights through the transparent window.

(2) The control apparatus 200 further includes an optical fiber array located in the shielding apparatus 204, and one side of the shielding apparatus 204 includes the transparent window. The control signal generator 201 emits the N optical control signals into N fibers in the optical fiber array in a form of N spatial lights through the transparent window, and respectively transmits the N optical control signals to the N optoelectronic detectors 202 through the N fibers. The N optical fibers are respectively connected to the N optoelectronic detectors 202.

(3) The control apparatus 200 further includes an optical fiber array located in the shielding apparatus 204, and one side of the shielding apparatus 204 includes the transparent window. The control signal generator 201 respectively emits the N optical control signals into the N optical fibers in the optical fiber array in a form of N spatial lights through the transparent window, and output light of each optical fiber is sent to a corresponding optoelectronic detector 202 in the form of spatial light. The N optical fibers respectively correspond to the N optoelectronic detectors 202, and an output end of the optical fiber needs to be relatively close to an input end of the corresponding optoelectronic detector 202, to reduce collimation difficulty and improve stability.

(4) The control apparatus 200 further includes an optical fiber array. Two ports of each optical fiber in the optical fiber array are respectively located inside and outside the shielding apparatus 204, and N optical fibers in the optical fiber array are respectively connected to N output ports of the control signal generator 201. The control signal generator 201 sends the generated N optical control signals to the N optical fibers in the optical fiber array through the N output ports, and then respectively transmits the N optical control signals to the N optoelectronic detectors 202 through the N optical fibers. The N optical fibers are respectively connected to the N optoelectronic detectors, and the optical fiber array and the shielding apparatus 204 need to be sealed.

(5) The control apparatus 200 further includes an optical fiber array, two ports of each optical fiber in the optical fiber array are respectively located inside and outside the shielding apparatus 204, and N optical fibers in the optical fiber array are respectively connected to N output ports of the control signal generator 201. The control signal generator 201 sends the generated N optical control signals to the N optical fibers in the optical fiber array through N output ports, and output light of each optical fiber is sent to a corresponding optoelectronic detector 202 in a form of spatial light. The N optical fibers respectively correspond to the N optoelectronic detectors, and the optical fiber array and the shielding apparatus 204 need to be sealed.

Figure 3:
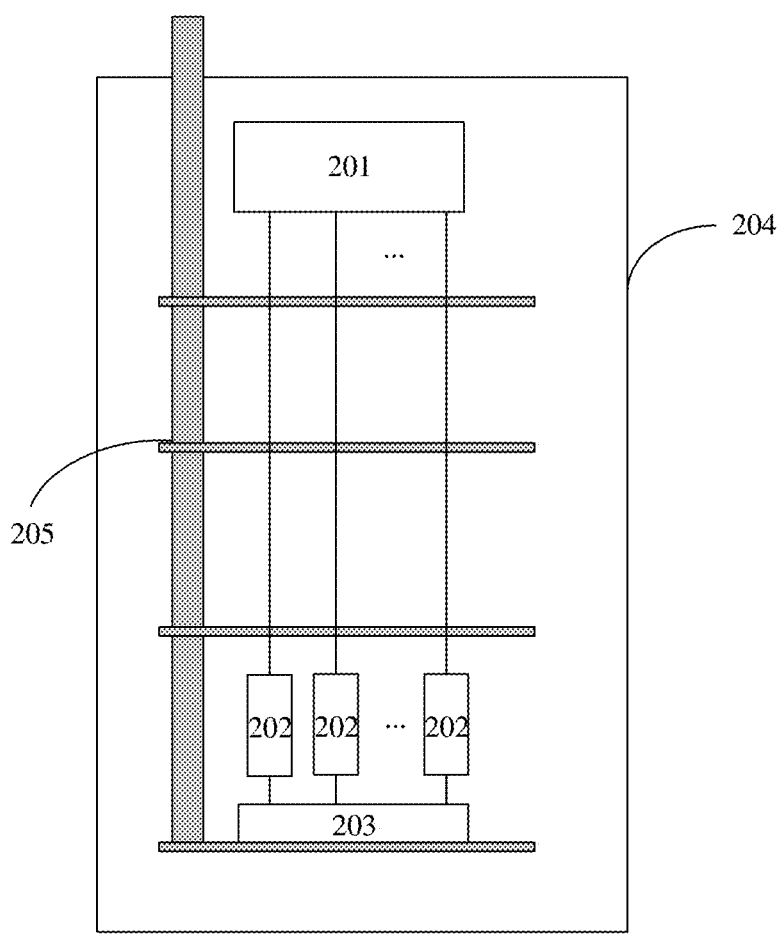
FIG. 3 is a block diagram of a structure of a quantum bit control apparatus according to another embodiment of this application.

In addition, the control signal generator 201 may be further located in the shielding apparatus 204. As shown in FIG. 3, the control signal generator 201 may be cooled by using the refrigerator, to reduce heat transfer from a source. In this case, a specific implementation in which the optical control signals are transferred from the control signal generator 201 to the optoelectronic detector 202 is as follows.

(1) Because the control signal generator 201 is located in the shielding apparatus 204, the N optical control signals generated by the control signal generator 201 do not need to penetrate the shielding apparatus 204, and may be directly emitted into the N optoelectronic detectors 202 in a form of spatial light.

(2) The control apparatus 200 further includes an optical fiber array located in the shielding apparatus 204. The optical fiber array includes N optical fibers. One end of each of the N optical fibers is respectively connected to N ports of the control signal generator 201, and the other end of each of the N optical fibers is respectively connected to N optoelectronic detectors 202. In this way, the control signal generator may send the N optical control signals to the N optoelectronic detectors 202 through the N optical fibers.

(3) The control apparatus 200 further includes an optical fiber array located in the shielding apparatus 204, and N optical fibers in the optical fiber array are respectively connected to N output ports of the control signal generator 201. The control signal generator 201 sends the N optical control signals to the N optical fibers in the optical fiber array through the N output ports, and then output light of each optical fiber is sent to a corresponding optoelectronic detector 202 in a form of spatial light. The N optical fibers respectively correspond to the N optoelectronic detectors.

For two different cases in which the control signal generator 201 is located inside the shielding apparatus 204 or outside the shielding apparatus 204, in the foregoing several implementations, heat transfer from the first temperature area to the second temperature area is greatly reduced regardless of whether optical fiber transmission, spatial light transmission, or a combination thereof is used. With same refrigeration power, more control signals can be supported, and system capacity expansion can be supported.

It should be understood that, when the refrigerator 206 includes a plurality of cold plates, and the plurality of cold plates perform refrigeration in sequence, when the transmission manner (1) is used, an intermediate cold plate (a cold plate located on an optical control signal optical path) also needs to include a transparent window, configured to transmit the spatial light to the optoelectronic detector 202. In other transfer manners, the optical control signals pass through the intermediate cold plate by using the optical fiber array, and when approaching the cold plate on which the optoelectronic detectors 202 are located, the optical control signals are transferred to the optoelectronic detectors 202 through the optical fiber or the spatial light. In this case, the intermediate cold plate only needs to ensure that the optical fiber array can pass through, for example, through holes, without forming the transparent window, and is not sensitive to the vibration of the cold plate.

Figure 4:
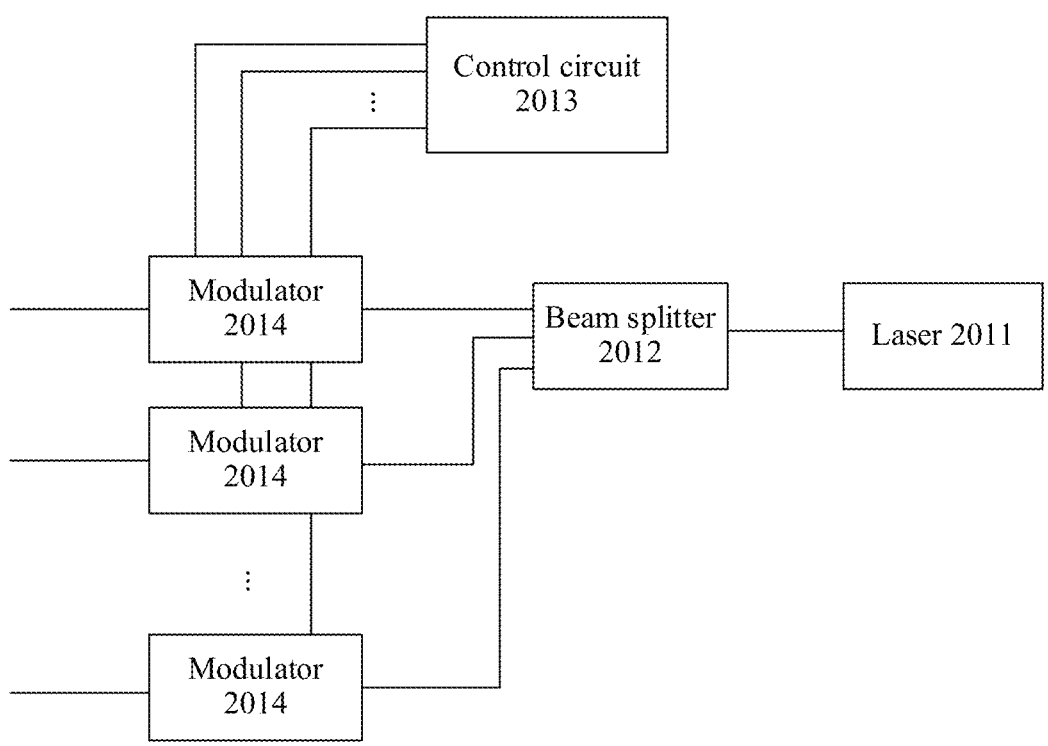
FIG. 4 is a block diagram of a structure of a control signal generator according to another embodiment of this application.

In an implementation of this embodiment of this application, the control signal generator 201 includes a laser 2011, a beam splitter 2012, a control circuit 2013, and N modulators 2014. A specific structure is shown in FIG. 4. The laser 2011 is configured to generate a laser signal, and send the laser signal to the beam splitter 2012. The beam splitter 2012 is configured to divide the laser signal into at least N laser signals, and respectively send the at least N laser signals to the N modulators 2014. The control circuit 2013 is configured to generate N control signals, and respectively load the N control signals to the N modulators 2014. The modulator 2014 is configured to modulate the laser signals according to the control signals to obtain the optical control signals, and send the optical control signals.

Specifically, the beam splitter 2012 divides the laser signal into at least N laser signals. The beam splitter 2012 may be a 1×N beam splitter, or may be formed by cascading a plurality of beam splitters with a small quantity of ports. Optical power of each channel of output signal of the beam splitter 2012 is determined based on an actual requirement, and may be a fixed proportion value, or may be consistent, but information included in each channel of output signal is the same. Because an electronically controlled signal required for controlling the quantum chip 203 is extremely weak, an optical control signal required by the quantum chip 203 is also very weak. Therefore, even if a same laser signal needs to be divided into a plurality of parts, intensity of the laser signal obtained after the splitting is sufficient.

The control circuit 2013 generates, according to a control requirement of the quantum bit, N control signals that can control the quantum bit, and sends the N control signals to the modulator 2014. The control requirement of the quantum bit may be a control requirement transferred by another component, device, software, or the like. For example, the control circuit 2013 is used as a component of a general-purpose quantum computer, and receives an operation instruction delivered by a general controller. Alternatively, the control requirement may be generated by the control circuit 2013, for example, a specific quantum computing, and an algorithm executed by the specific quantum computing is determined. The control circuit 2013 is equivalent to the general controller, and the requirement is directly written into the control circuit 2013.

Optionally, there may be a plurality of lasers, and a quantity of lasers does not exceed a quantity N of modulators, provided that each modulator can receive a laser signal. For example, assuming that N is 100, if the quantity of lasers is 100, no beam splitter is required, and the 100 lasers may be directly connected to 100 modulators. If the quantity of the lasers is 51, the beam splitter may be a 1×50 beam splitter, a laser signal output by one of the lasers is divided into 50 laser signals, and remaining 50 lasers are connected to corresponding modulators. In addition, there may also be a plurality of beam splitters. Still using the example in which N is wo and the quantity of lasers is 51, the beam splitter may be formed by seven 1×8 beam splitters, and output light of seven of the lasers is divided into eight output lights, to obtain a total of 56 laser signals, remaining 44 lasers are directly connected to the modulators. The laser and the beam splitter have a plurality of combinations, provided that each modulator can receive a laser signal. The quantity of lasers and the quantity of beam splitters are not limited in this embodiment of this application.

Figure 5:
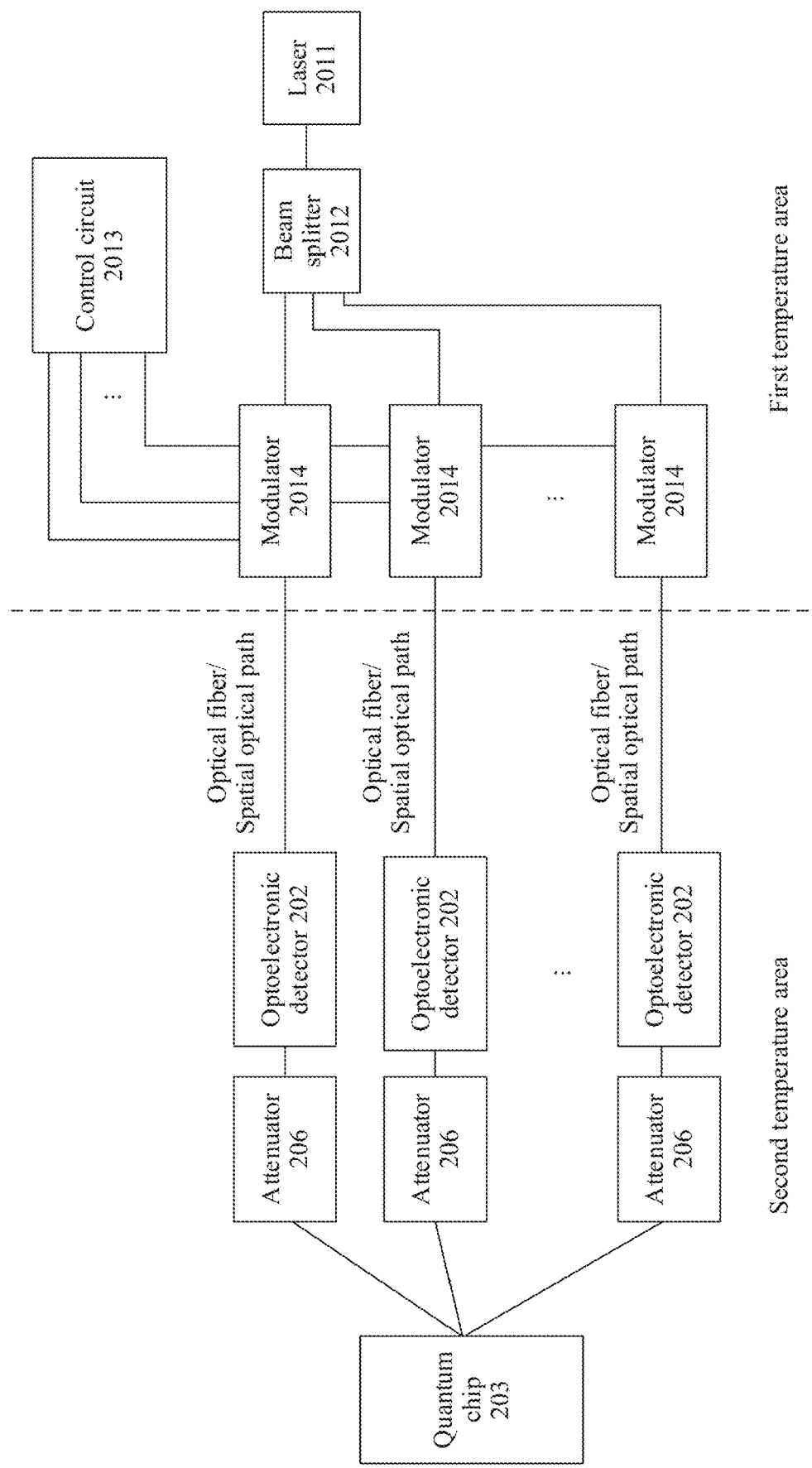
FIG. 5 is a block diagram of a structure of a quantum bit control apparatus according to another embodiment of this application.

Optionally, the control apparatus 200 further includes an attenuator 206. When each of the N control signals includes one subcarrier, there are N attenuators 206, and the N attenuators 206 are respectively located between the N optoelectronic detectors 202 and the quantum chip 203, a block diagram of a structure is shown in FIG. 5 (the shielding apparatus 204 and the refrigerator 205 are not shown in the figure). Each attenuator 206 may receive an electronically controlled signal output by one optoelectronic detector 202, attenuate the electronically controlled signal, and send the attenuated signal to the quantum chip 203. The attenuator 206 may be located on a cold plate whose temperature is between the cold plate on which the optoelectronic detectors 202 are located and the cold plate on which the quantum chip 203 is located, or located on the cold plate that is the same as the quantum chip 203, to perform a heat conduction function, and further reduce a requirement on refrigeration power.

In an actual application, manipulation characteristic frequencies of different superconducting quantum bits in the quantum chip may also be different. Therefore, for a plurality of superconducting quantum bits with different control frequencies, multi-frequency modulation may be performed on an optical signal. After optoelectronic detection, control signals for the different quantum bits are divided by frequency division or beam splitting and filtering in electrical domain, to control a plurality of quantum bits.

Specifically, each of the N control signals includes M subcarriers, the control apparatus 200 further includes N frequency dividers 207, and M is a positive integer greater than 1. The N frequency dividers 207 respectively correspond to the N optoelectronic detectors 202. Each frequency divider 207 receives the electronically controlled signal sent by a corresponding optoelectronic detector 202, divides the electronically controlled signal into M electronically controlled signals based on frequencies of the M subcarriers of the electronically controlled signal, where each of the M electronically controlled signals corresponds to one subcarrier frequency, and sends the M signals to the quantum chip 202. Each channel of control signal includes the M subcarriers, which may be implemented by the control circuit 2013. It is only required that each of the N control signals generated by the control circuit 2013 includes the M subcarriers.

Figure 6:
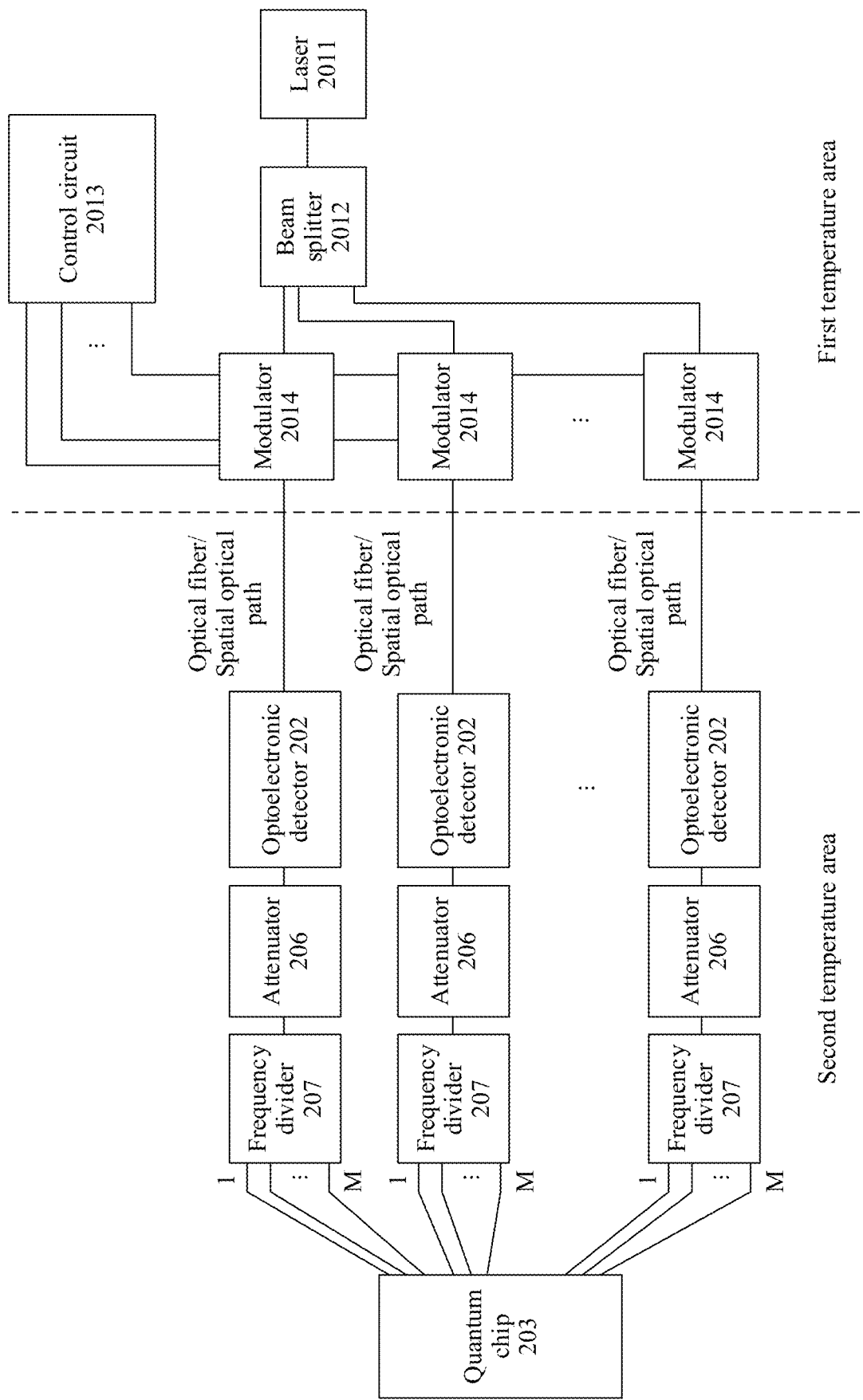
FIG. 6 is a block diagram of a structure of a quantum bit control apparatus according to another embodiment of this application.
Figure 7:
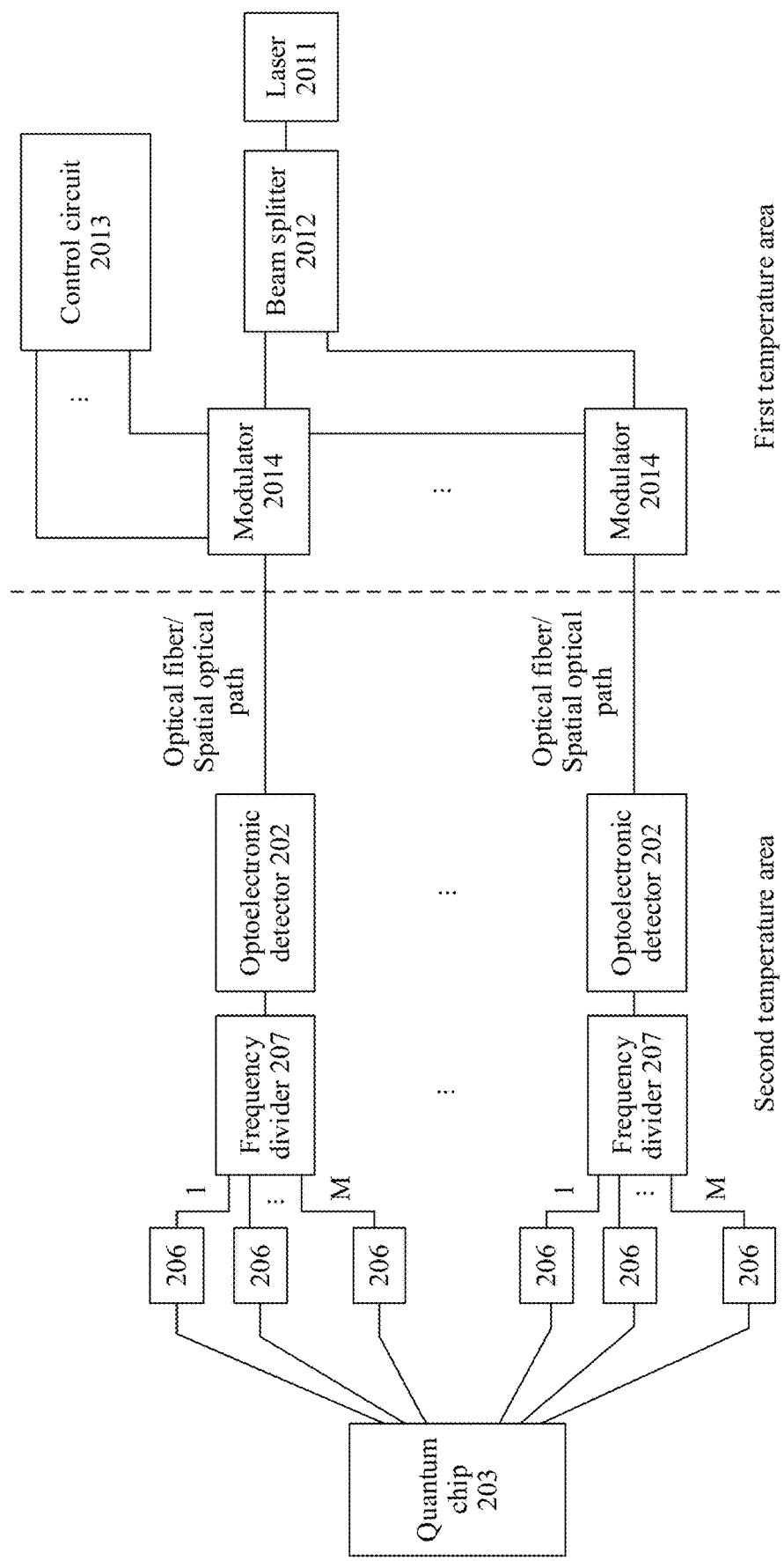
FIG. 7 is a block diagram of a structure of a quantum bit control apparatus according to another embodiment of this application.

Optionally, the attenuator 206 may be located before the frequency divider 207, or may be located after the frequency divider 207. If the attenuator 206 is located before the frequency divider 207, the attenuator 206 is located between each frequency divider 207 and a corresponding optoelectronic detector 202, a total quantity of the attenuators 206 is N, and a block diagram of a structure is shown in FIG. 6 (the shielding apparatus 204 and the refrigerator 205 are not shown in the figure). If the attenuator 206 is located after the frequency divider 207, the control apparatus 200 further includes N×M attenuators 206, every M attenuators 206 in the N×M attenuators correspond to one frequency divider 207, and a block diagram of a structure is shown in FIG. 7 (the shielding apparatus 204 and the refrigerator 205 are not shown in the figure). Each attenuator 206 is configured to receive an electronically controlled signal from the frequency divider 207, attenuate the electronically controlled signal, and send the attenuated electronically controlled signal to the quantum chip 202.

In this embodiment of this application, sending the optical control signals in a form of frequency division multiplexing can reduce a quantity of beam splitters and modulators in the control signal generator 201, and reduce costs. In addition, a quantity of optoelectronic detectors can be reduced, which further reduces the costs and total heat of the optoelectronic detectors. With same refrigeration power, more control signals can be supported, and system capacity expansion can be better supported.

Optionally, the frequency divider 207 may alternatively be replaced with a combination of a power divider and a filter. For example, a 1×M frequency divider may be replaced by a 1×M power divider and M filters, and M output ports of the 1×M power divider are respectively connected to input ports of the M filters. The power divider is configured to divide the received electronically controlled signal into M electronically controlled signals based on power, and send each channel of electronically controlled signal to a corresponding filter in the M filters. Each filter has a different filtering frequency, and is configured to filter out a subcarrier in the electronically controlled signal based on the filtering frequency of the filter, and send the electronically controlled signal. In this embodiment, a passive component is used to replace an active component (frequency divider), and there is no problem that the component generates heat.

It should be noted that, several specific implementations of transferring the optical control signal from the control signal generator 201 to the optoelectronic detector 202 disclosed in the foregoing embodiment are not related to a structure of the control signal generator 201 and an arrangement between the attenuator 206 and the frequency divider 207. Therefore, the five transfer manners disclosed in the foregoing embodiment may be combined with any structure of the control signal generator 201, or may be combined with any arrangement of the attenuator 206 and the frequency divider 207. All solutions disclosed in this application can be supported.

In the several embodiments provided in the present application, it should be understood that the disclosed apparatus may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces, indirect couplings or communication connections between the apparatuses or units, or electrical connections, mechanical connections, or connections in other forms.

What is described above is merely example embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:

1. A quantum bit control apparatus, comprising:
a control signal generator;
N optoelectronic detectors, wherein N is a positive integer greater than 1;
a quantum chip; and
a shielding apparatus;
wherein the N optoelectronic detectors are disposed in the shielding apparatus, and wherein an inner part of the shielding apparatus is in a vacuum state;
wherein the control signal generator is disposed in a first temperature area, and wherein the control signal generator is configured to generate N optical control signals, and is further configured to send the N optical control signals, respectively, to the N optoelectronic detectors;
wherein the N optoelectronic detectors are disposed in a second temperature area, and wherein a temperature of the second temperature area is lower than a temperature of the first temperature area;
wherein the N optoelectronic detectors are configured to convert the received optical control signals into electronically controlled signals, and are further configured to send the electronically controlled signals to the quantum chip disposed in the shielding apparatus; and
wherein the quantum chip is disposed in the second temperature area, and is configured to control a quantum bit in the quantum chip based on the received N electronically controlled signals.

2. The control apparatus according to claim 1, further comprising a refrigerator, wherein the refrigerator comprises a refrigeration pipe and a plurality of cold plates separately connected to the refrigeration pipe, wherein a part of the refrigeration pipe is disposed in the shielding apparatus, and wherein the plurality of cold plates are disposed in the shielding apparatus; and
wherein the quantum chip is at least one of disposed on or connected to a first cold plate of the plurality of cold plates, wherein the first cold plate has a lowest temperature of the plurality of cold plates.

3. The control apparatus according to claim 1, wherein a first side of the shielding apparatus comprises a transparent window, and wherein the control signal generator sends the N optical control signals into the shielding apparatus in a form of N spatial lights through the transparent window.

4. The control apparatus according to claim 3, wherein the N spatial lights are respectively emitted into the N optoelectronic detectors.

5. The control apparatus according to claim 3, further comprising an optical fiber array disposed in the shielding apparatus; and
wherein the N spatial lights are respectively emitted into N optical fibers in the optical fiber array, wherein the N optical fibers are respectively connected to the N optoelectronic detectors.

6. The control apparatus according to claim 3, further comprising an optical fiber array disposed in the shielding apparatus;
wherein the N spatial lights are respectively emitted into N optical fibers in the optical fiber array, wherein each of the N optical fibers respectively correspond to a respective optoelectronic detector of the N optoelectronic detectors, and wherein output light of each of the N optical fibers is sent, in a form of spatial light, to a corresponding optoelectronic detector of the N optoelectronic detectors.

7. The control apparatus according to claim 1, further comprising an optical fiber array, wherein two ports of each optical fiber in the optical fiber array are respectively disposed inside and outside the shielding apparatus, and wherein N optical fibers in the optical fiber array are respectively connected to N output ports of the control signal generator.

8. The control apparatus according to claim 7, wherein the control signal generator is further configured to send the N optical control signals to the N optical fibers through the N output ports, and wherein the N optical fibers are respectively connected to the N optoelectronic detectors.

9. The control apparatus according to claim 7, wherein the N optical control signals generated by the control signal generator are sent to the N optical fibers in the optical fiber array through the N output ports, wherein the N optical fibers respectively correspond to the N optoelectronic detectors, and wherein output light of each optical fiber of the N optical fibers is sent to a corresponding optoelectronic detector of the N optoelectronic detectors in a form of spatial light.

10. The control apparatus according to claim 1, wherein the control signal generator is disposed in the shielding apparatus, and wherein the control signal generator respectively emits the N optical control signals to the N optoelectronic detectors in a form of spatial light.

11. The control apparatus according to claim 1, wherein the control signal generator is disposed in the shielding apparatus; and
wherein the control apparatus further comprises an optical fiber array disposed in the shielding apparatus, wherein the optical fiber array comprises N optical fibers, wherein a first end of each optical fiber of the N optical fibers is connected to a respective port of N ports of the control signal generator, and wherein a second end of each of the N optical fibers is connected to a respective optoelectronic detector the N optoelectronic detectors.

12. The control apparatus according to claim 1, wherein the control signal generator is disposed in the shielding apparatus; and wherein the control apparatus further comprises an optical fiber array disposed in the shielding apparatus, wherein the N optical control signals generated by the control signal generator are sent to N optical fibers in the optical fiber array through N output ports, wherein the N optical fibers respectively correspond to the N optoelectronic detectors, and wherein output light of each optical fiber of the N optical fibers is sent to a corresponding optoelectronic detector of the N optoelectronic detectors in a form of spatial light.

13. The control apparatus according to claim 1, wherein the control signal generator comprises a laser, a beam splitter, a control circuit, and N modulators;

wherein the laser is configured to generate a laser signal, and is further configured to send the laser signal to the beam splitter;

wherein the beam splitter is configured to divide the laser signal into at least N laser signals, and is further configured to respectively send the at least N laser signals to the N modulators;

wherein the control circuit is configured to generate N control signals, and respectively load the N control signals to the N modulators; and wherein the N modulators are configured to modulate the laser signals according to the control signals to obtain the N optical control signals, and send the N optical control signals.

14. The control apparatus according to claim 13, wherein each of the N control signals comprises one subcarrier, wherein the control apparatus further comprises N attenuators, and wherein the N attenuators are respectively disposed between the N optoelectronic detectors and the quantum chip.

15. The control apparatus according to claim 13, wherein each of the N control signals comprises M subcarriers, wherein the control apparatus further comprises N frequency dividers, and wherein M is a positive integer greater than 1; and wherein each frequency divider of the N frequency dividers corresponds to a respective optoelectronic detector of the N optoelectronic detectors, and wherein each frequency divider is configured to receive at least one electronically controlled signal, of the electronically controlled signals, sent by a corresponding optoelectronic detector, is further configured to divide the at least one electronically controlled signal into M electronically controlled signals based on frequencies of the M subcarriers of the electronically controlled signal, and is further configured to send the M electronically controlled signals to the quantum chip.

16. The control apparatus according to claim 15, wherein the control apparatus further comprises N attenuators; and wherein each attenuator of the N attenuators is separately connected to a respective optoelectronic detector of the N optoelectronic detectors and is further connected to a frequency divider corresponding to the optoelectronic detector.

17. The control apparatus according to claim 15, further comprising N×M attenuators, wherein every M attenuators of the N×M attenuators corresponds to one frequency divider, and each attenuator of the N×M attenuators is configured to receive an electronically controlled signal from the frequency divider, is further configured to attenuate the electronically controlled signal, and is further configured to send the attenuated electronically controlled signal to the quantum chip.

18. The control apparatus according to claim 15, wherein the frequency divider comprises a power divider and M filters with different filtering frequencies;

wherein the power divider is configured to receive the at least one electronically controlled signal sent by the corresponding optoelectronic detector, is further configured to divide the electronically controlled signal into M electronically controlled signals based on a preset power ratio, and is further configured to respectively send the M electronically controlled signals to the M filters; and wherein each filter in the M filters is configured to filter out one subcarrier in the electronically controlled signal based on a filtering frequency of the filter, and is further configured to send the subcarrier.

19. A system, comprising:

a control signal generator;

N optoelectronic detectors, wherein N is a positive integer greater than 1;

a quantum chip; and a shielding apparatus;

wherein the N optoelectronic detectors are disposed in the shielding apparatus, and wherein an inner part of the shielding apparatus is in a vacuum state;

wherein the control signal generator is disposed in a first temperature area, and wherein the control signal generator is configured to generate N optical control signals, and is further configured to send the N optical control signals, respectively, to the N optoelectronic detectors;

wherein the N optoelectronic detectors are disposed in a second temperature area, and wherein a temperature of the second temperature area is lower than a temperature of the first temperature area;

wherein the N optoelectronic detectors are configured to generate electronically controlled signals according to the received optical control signals, and are further configured to send the electronically controlled signals to the quantum chip disposed in the shielding apparatus; and wherein the quantum chip is disposed in the second temperature area, and is configured to control a quantum bit in the quantum chip based on the received N electronically controlled signals.

20. A system, comprising:

a control signal generator;

N optoelectronic detectors, wherein N is a positive integer greater than 1;

a quantum chip; and a shielding apparatus;

wherein the N optoelectronic detectors are disposed in the shielding apparatus;

wherein the control signal generator is disposed in a first temperature area, and wherein the control signal generator is configured to generate N optical control signals, and is further configured to send the N optical control signals, respectively, to the N optoelectronic detectors as spatial light;

wherein the N optoelectronic detectors are disposed in a second temperature area, and wherein a temperature of the second temperature area is lower than a temperature of the first temperature area;

wherein the N optoelectronic detectors are configured to generate electronically controlled signals according to the received optical control signals, and are further configured to send the electronically controlled signals to the quantum chip disposed in the shielding apparatus; and wherein the quantum chip is disposed in the second temperature area, and is configured to control a quantum bit in the quantum chip based on the received N electronically controlled signals.

* * * * *